United States Patent [19]
Zachry

[11] 4,429,349
[45] Jan. 31, 1984

[54] COIL CONNECTOR

[75] Inventor: Clyde L. Zachry, San Marcos, Calif.

[73] Assignee: Burroughs Corporation, Detroit, Mich.

[21] Appl. No.: 397,312

[22] Filed: Jul. 12, 1982

Related U.S. Application Data

[63] Continuation of Ser. No. 192,305, Sep. 30, 1980, abandoned.

[51] Int. Cl.³ .............................................. H05K 1/14
[52] U.S. Cl. .................................... 361/414; 29/831; 29/857; 365/2; 361/412
[58] Field of Search .................... 361/412, 414, 413; 365/2, 28, 53; 29/831, 857

[56] References Cited

U.S. PATENT DOCUMENTS

| | | | |
|---|---|---|---|
| 3,958,155 | 5/1976 | Bogholtz et al. | 361/414 |
| 4,101,970 | 7/1978 | Saito et al. | 365/2 |
| 4,110,838 | 8/1978 | Noe | 365/2 |
| 4,160,274 | 7/1979 | Stephenson, Jr. | 365/2 |
| 4,219,882 | 8/1980 | Cooper et al. | 365/2 |

OTHER PUBLICATIONS

Layton, Wilber T., WO 81/00167, Magnetic Bubble Package With Chips Mounted Face-to-Face, Jan. 22, 1981.

Primary Examiner—R. R. Kucia
Attorney, Agent, or Firm—John J. McCormack; Nathan Cass; Kevin R. Peterson

[57] ABSTRACT

Disclosed is an inter-connect board adapted to regularize the means of connecting chip elements, such as coils for a bubble memory, to various related I/O leads, without making this interconnection manually.

9 Claims, 8 Drawing Figures

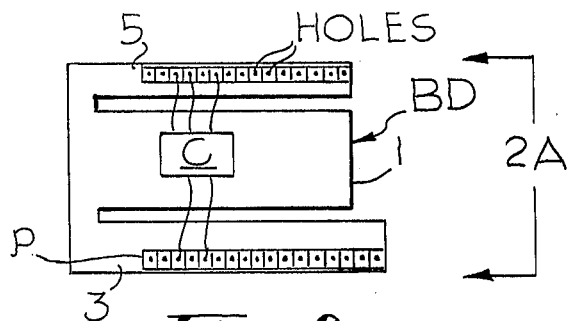
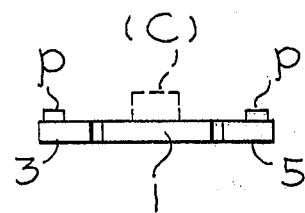
Fig. 2  Fig. 2A
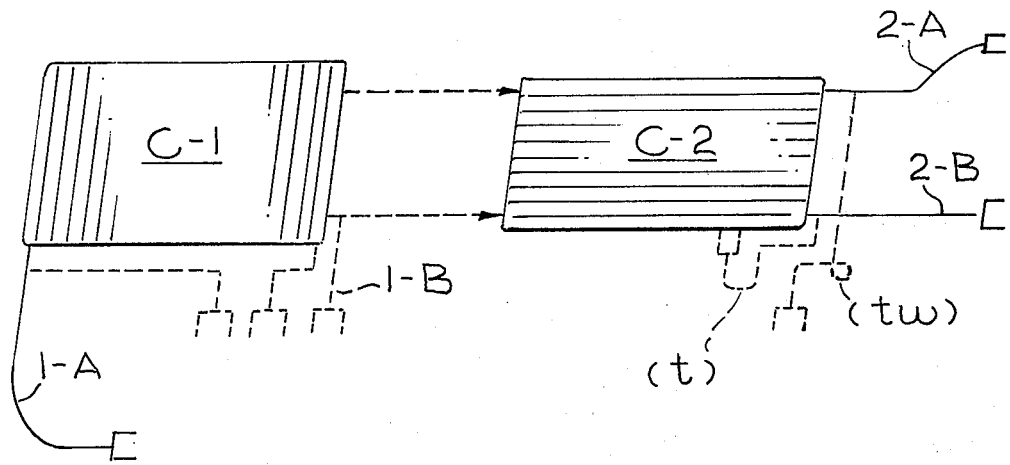
Fig. 3
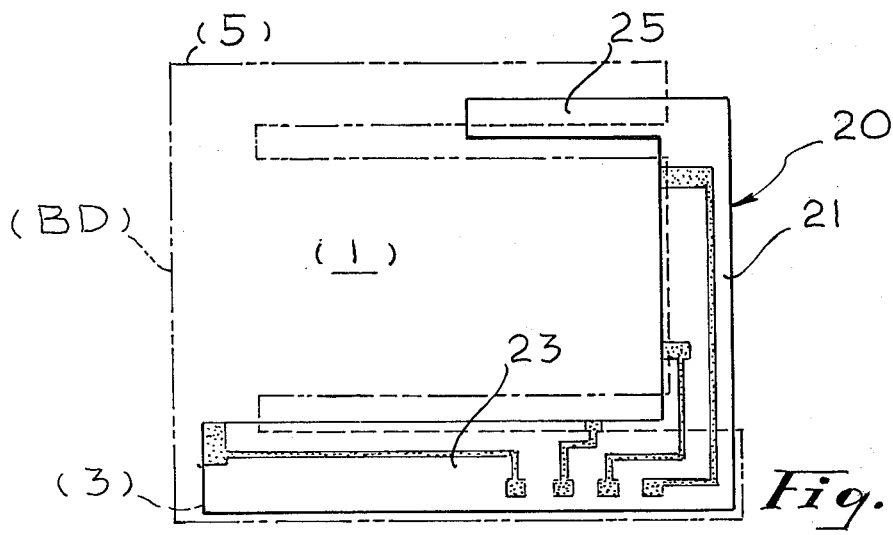
Fig. 4

COIL CONNECTOR

This is a continuation, of application Ser. No. 192,305, filed Sept. 30, 1980 now abandoned.

INTRODUCTION, FEATURES

Workers in the art of making and/or using microelectronic chips, and like miniaturized electronic packages, are well aware that making electrical connections between associated components, such as coils, and the outside world often leads to problems. For instance, the tiny bubble memory chips mounted on a substrate board must be surrounded with a pair of coils and it is presently problematical to connect the coil-leads to respective input/output contacts without creating problems of variable performance, lead-failure and the like. Such problems result directly from the present-day practise of making such interconnections manually. Here, this problem may be considered in respect of a bubble memory chip C mounted on a conventional substrate board BD as seen in FIG. 1. Chip C is mounted in operative relation with a pair of coils C-1, C-2 (chip C shown in phantom under the coils) as known in the art, each coil having a respective pair of leads, 1A, 1B and 2A, 2B.

Board BD will be recognized as conventional and known in the art for mounting bubble memory chips, being shown in plan view in FIG. 2, as comprising a center portion 1 for mounting chip C (or plurality thereof). Conventional connectors cc lead from chip C to a respective printed pad and associated conductor ic on board BD as known in the art, with each conductor ic extending between its pad and a respective terminal pad p. Each pad p is preferably provided with a thru-hole adapted to accept a respective outer lead oL, being bonded in this hole conventionally (see FIG. 2A). A pair of wing-portions 3, 5 are projected from a common base and spaced from outer section 1 to accommodate the pair of oppositely-wound coils C-1, C-2 as aforementioned and known in the art. Each "wing" 3, 5 will be understood as having an array of the mentioned like, spaced conductive contact points (terminal pads p) as indicated in FIG. 2. Wing 5 is depicted as shorter than wing 3, though this is a matter of choice.

As workers know, an outstanding difficulty in the present art of fabricating such bubble memory packages is how to connect such coil-leads to respective input/output leads without creating performance problems. Presently, it is customary to make these connections manually, with an assembler being forced to bend, fold, twist and loop the coil leads in the course of doing so. As very schematically indicated in FIG. 3, the oil leads ("runs") are thus manipulated so as to be directed to a particular respective contact-terminal, such as indicated on board BD in FIG. 1 for leads 1A, 1B; 2A, 2B. These leads are shown "in-full" and unmanipulated in FIG. 3, with their proposed final configuration (as connected to respective terminals on board BD), being indicated "in phantom". Here, appropriate turns t and twists tw are indicated schematically (in phantom).

More particularly, workers will recognize that, to fabricate the assembly A in FIG. 1, one must suitably mount the chip(s) C on the board BD (as in FIG. 2), connect their leads cc to respective board conductors ic and then envelop it (them) with coils C-1, C-2 (as functionally indicated in FIG. 2). Problematic leads, such as coil leads 1A, 1B; 2A, 2B must, according to present practice, be manually manipulated to assume the desired final configuration and be joined to respective connector means as in FIG. 1 (see terminal pads p bonded to output leads oL—commonly, a lead oL is threaded through the plated-thru hole in a respective pad p and bonded to a respective chip-lead; see FIG. 2A). The bending, twisting and looping indicated in phantom in FIG. 3 schematically indicates the manipulations involved. These manipulations commonly create performance problems—it is an object of this invention to eliminate them, using a novel interconnect board.

Workers in the art will recognize the problems involved in making such connections manually, with results that are less than satisfying. Also, it is undesirable for a semi-skilled assembler to have to take the time, expense and trouble, etc., to grip each of these leads, then twist it, fold it, etc.—routing it into the correct configuration manually and so join it to the proper terminal on board BD as indicated. Workers in the art recognize that such manipulation can readily break or fatigue a lead often leading to operational disturbances, e.g., when the mode of connection is highly variable. That is, lead-length will commonly vary from unit to unit (and especially from operator to operator) and will depend on the (variable) judgement of an operator as to what kinds of twists and turns it takes, and how many are necessary to make a given connection. Moreover, the flexibility of sections 1, 3, 5 can make it more difficult to interconnect points thereon.

Thus, the routing of such coil interconnect wires during hard-wiring operations to various output pins or like connectors leaves much to be desired.

Besides the obvious disadvantages, such "variable-length" leads can induce problems associated with the varying of lead-impedance from unit to unit and certain "loops" therein can be the cause of inductive noise, especially under high frequency operation [note loop or twist tw in FIG. 3—the impedance value of a lead will change with its length, of course]. Any uncontemplated loop or turn can, of course, lead to unplanned, uncontrollable "magnetic disturbances" beyond those designed into the package [workers are cognizant of the problems caused by such variable or uncontrolled loop]. The invention is intended to meet this problem, providing a coil interconnect board which will eliminate such handling expense and difficulties and the associated variability in the length and configuration of such leads.

Another difficulty associated with the configuration of FIGS. 1-3 is that the common "E-shaped" configuration of the PC board is less than ideal for optimal mechanical stability and rigidity. It is obvious that the cantilever portions 1, 3, 5 offer extended arms which are rather long, thin and flexible and thus quite readily deflected causing stresses which may be damaging. The invention provides a coil interconnect board which is also intended to meet this problem—making the resultant package considerably more rigid and thus better protecting the contents mounted thereon.

It is an object of this invention to meet the aforegoing difficulties and provide the mentioned and other related features. A more particular object is to provide improved predictable interconnect means between miniature components and terminals on a PC board.

The present invention is directed towards providing improved bubble assemblies and associated packages better adapted to address the foregoing problems and objectives. It is especially directed toward providing improved magnetic bubble packages which are rigidified and which do not exhibit variable or unwanted characteristics resulting from manual lead configuring. A related object to provide such a magnetic bubble package which includes a "flat lead" interconnect board between chip leads and input/output terminals.

The foregoing and other features, objects andd advantages according to this invention will be better appreciated and become more apparent upon consideration of the following description of the preferred embodiments, taken in conjunction with the attached drawings, wherein like reference indicia denote like elements.

BRIEF DESCRIPTION OF THE DRAWINGS

FIG. 1 is an upper isometric view of a relatively conventional bubble memory package with the printed circuit board thereof being shown in plan view in FIG. 2 and sectioned in FIG. 2A; while FIG. 3 depicts the coils therefor exploded apart;

FIG. 4 is a plan view of a preferred novel "interconnect board" adapted for use with such a package, according to the invention, the board being depicted in upper perspective in FIG. 5; as-connected with the coil-leads in FIG. 6 and as-bonded upon the PC board of FIGS. 1 and 2 in FIG. 7.

Figure 1:
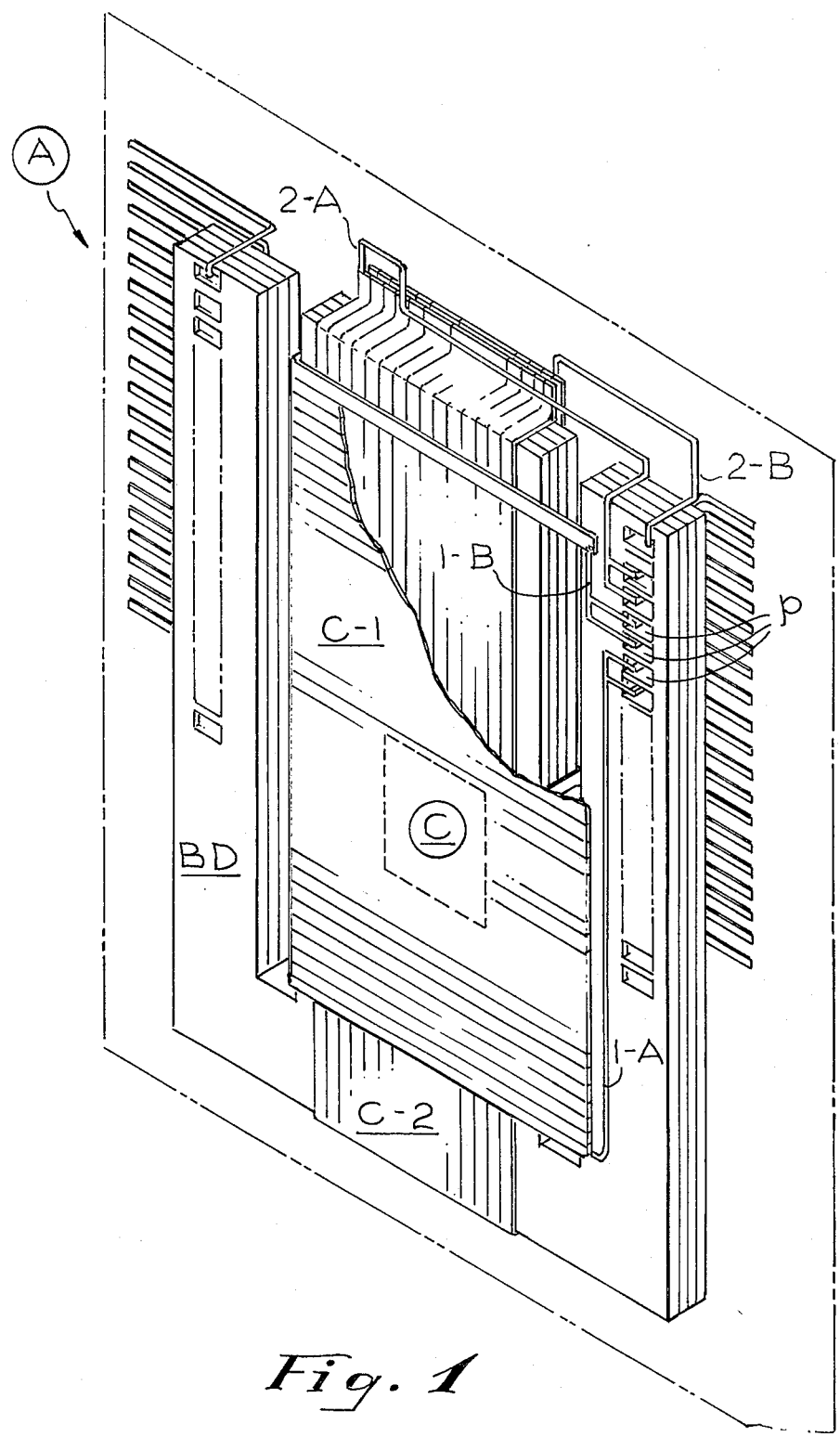

PREFERRED EMBODIMENTS; generally:

FIGS. 4-7 indicate one "coil-interconnect board" embodiment of the invention as adapted to improve a bubble memory package of the type indicated in FIGS. 1-3.

A "magnetic bubble package" of the type have contemplated will be understood as comprising one or more bubble chips disposed between bias magnets and enclosing yoke structure, along with suitable mounting means, and interconnection means, as known in the art. Thermal control means are often added. Each magnetic bubble chip, or module, typically comprises a layer of "garnet-like" material disposed on a substrate, with a pair of orthogonally-wound field drive coils surrounding the chip and adapted to provide rotational, "in-plane" magnetic fields therein. The bias magnets are adapted to provide a bias field virtually normal to the plane of the substrate so as to maintain "magnetic bubbles" in the "garnet-like" material.

Connector means are also typically provided to connect a bubble chip to the outside world, to other chips, to control means, etc. Such connector means conventionally include a printed circuit board (PCB) adapted to mount the chips, with printed conductors extending between "chip leads" and output pads, pins or like connectors. This, of course, necessitates making an interconnection between a chip lead and an outside (I/O) connector. Such a multiplicity of connections is typically made via soldered joints.

DETAILS OF THE PREFERRED EMBODIMENT

An improved magnetic bubble packaging assembly is here taught, one intended to improve the reliability, simplicity and add to the mechanical stability of the package. Such will now be described—first in terms of the preferred embodiment shown in FIGS. 4-7.

Embodiment of FIGS. 4-7:

FIGS. 4-7 disclose, as a preferred embodiment of the invention, a package P of bubble memory component(s) which include an inner assembly C comprising one or more magnetic bubble chips, disposed, for example, on a substrate board. (Here, on the center section 1 of an E-shaped PC board, with "containment means" about and above these, as workers know). The substrate board supports a pair of superposed, chip-enclosing, orthogonally oriented drive coils C-1, C-2 as part of the assembly. The coils are adapted to generate magnetic fields to drive "bubbles" rotationally within these chips, as is well known in the art.

The substrate board may comprise a printed circuit board (PCB) on which are printed conductors for interchip communication and terminals (pads) for external connection to the outside world. Assembly P, and related structures, may be mounted and sealed protectively within a magnet yoke (not shown) using conventional putting or a like sealant.

Bias magnets (not shown) will also be understood as to be conventially disposed on opposite sides of the inner assembly P—as close as possible thereto, being adapted to provide a suitable intermediate "magnetic bias", i.e., a field adapted to form and maintain bubbles in the magnetic bubble material within the chips. Various structural support means, connector etc., may also be provided as known in the art; for instance, as mentioned in U.S. Pat. Nos. 4,198,688 and 4,165,536, commonly assigned herewith, and hereby incorporated by reference to the extent applicable.

Except as described herein and in the herecited references, it will be understood that the manufacture, structure, operation of bubble memory components will be carried out as presently dictated by good practice in the art. And, without going into detail, various optional features may obviously be added to bubble memory package 7 with various optional structural and thermal-protective expedients (e.g., as indicated in the cited patents).

The invention will now be described in terms of the preferred embodiment of FIGS. 4-7; then, some results and advantages indicated.

Figures 5, 6:
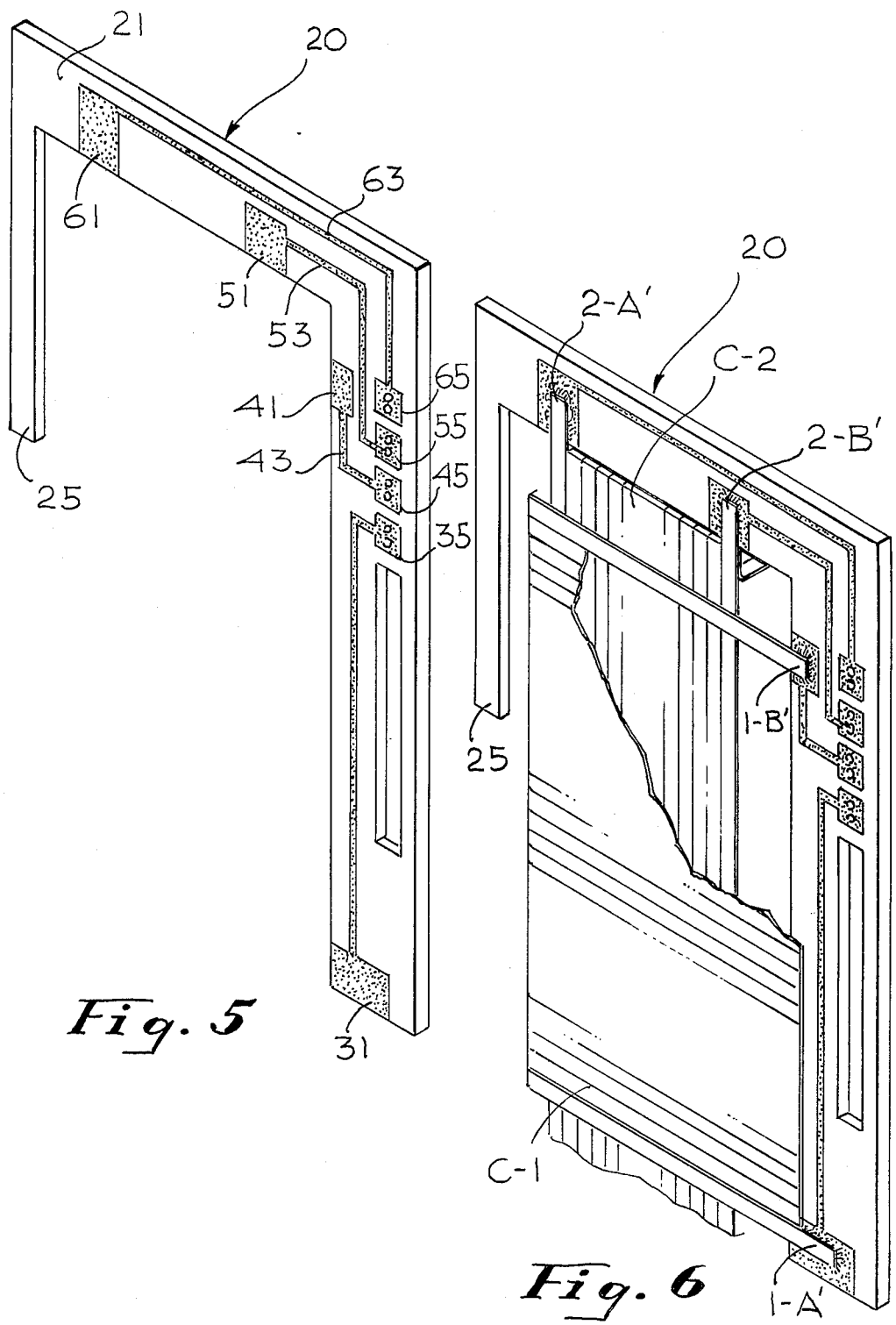

A preferred embodiment 20 of an interconnect board ("I-c board") according to the invention is shown in FIG. 5 (upper perspective) and, more generally, in the plan view of FIG. 4 where it is shown superposed on (and bonded-to) PCB substrate BD, shown in phantom. I-c board 20 is comprised of PCB material of suitable thickness, fashioned in a U-shape and dimensioned to span the three extended wing portions 1, 3, 5 of the E-shaped substrate BD, so as to be attached thereto rigidifyingly. Preferably, one elongate arm 23 of I-c board 20 is roughly congruent with subjected wing 3 of substrate BD and is adapted to carry contact pads 35, 45, etc., for ohmic connection with prescribed printed leads 33, 43, 54, 63, to respective outside contacts (not shown, but well known). Opposing arm 25 is configured to overlie the (distal end of the) opposite wing 5 of substrate BD (or at least the inner-edge thereof), arms 23, 25 being joined by transverse mid-section 21. Section 21 is intended to be bonded to the distal edge of center-portion 1—sections 21, 23, 25 preferably being epoxyed to BD before the overall assembly is potted.

Figure 7:
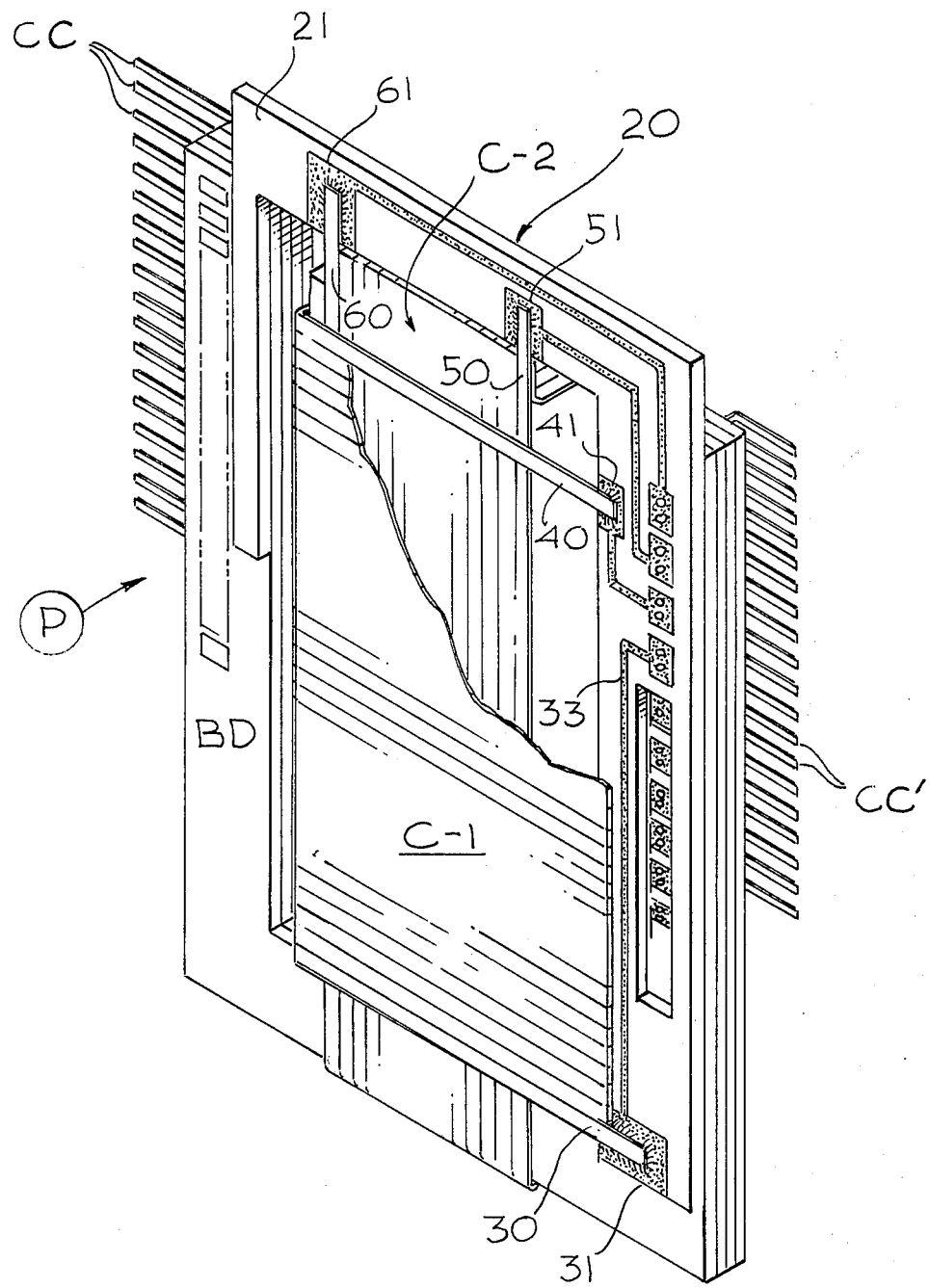

As FIGS. 6 and 7 indicate, I-c board 20 is adapted to carry certain printed circuit conductor segments 33, 43, 53, 63; each extending from an associated connector pad (35, 45, 55, 65, respectively) to another solder pad 31, 41, 51, 61, respectively. The number and placement of such conductor segments is obviously a matter of choice and is intended to replace "free-standing" leads which would conventionally have to be manually bent into (something approaching) "idealized" configurations and suitably joined to respective terminals.

More specifically, a pair of leads from each of coils C-1, C-2 is so replaced here; whereby coil C-1 need only have short stubs 1-A', 1-B' connected (e.g., soldered) to respective pads 31, 41; while, similarly, companion coil C-2 has like stubs 2-A', 2-B' so connected to respective pads 51, 61. Workers will immediately perceive enormous advantage over the usual mode of manually manipulating coil leads as described above.

Once board 20 is bonded to substrate BD, the improved bubble memory (inner) package P is now completed, as indicated in FIG. 7. I/O leads oL, oL' lead to interpackage means which provide interconnection to the outside world.

The above-taught "coil-interconnect board" according to the invention will be seen as a superior, relatively constant, semi-automatic way of interconnecting coil leads and output terminals; while controlling, or decreasing, any random noise and/or impedance variations therefrom, and also adding mechanical stability to the overall package. This teaching offers a consistant, regular mode of making the connections, with lead-length kept constant and with no twists or loops to introduce random magnetic noise or the like. Also, there is considerably less handling, bending, twisting, and other manual manipulation of leads, with resultant decrease in expense, lead-breakage and the like.

And, as a result, there, of course, will be a great reduction in associated operational anomalies caused by varying lead lengths and unwanted inductances, there being no uncontemplated varying lead loops, twists and bends. And with such a connector board bonded to the substrate, the rigidity and stability of the substrate (especially its wing portions) and of the overall package, will, of course, be enhanced, as workers will perceive.

Conclusion:

It will be appreciated that novel bubble memory packaging arrangements and techniques as here described may be used with the indicated, and other related, "mini-components" mounted on such substrates (e.g., to connect leads from miniature coils of a relay solenoid, motor, etc.). The invention may be advantageously employed in various ways with other packages, though such arrangements will be seen as especially advantageous in conjunction with bubble memory devices like those described and shown.

It will also be understood that the preferred embodiments described herein are only exemplary and that they are susceptible of many modifications and variations in construction, arrangement and use, without departing from the spirit of the invention. For example, it should not be assumed that the coil leads must necessarily comprise four or project from any set direction.

Further modifications of the invention are also possible. For example, the means and methods disclosed herein will also be applicable, in certain instances, with other mini-components, and may be used with various other package means. Further, various non-illustrated variants of such a bubble memory package will be contemplated within the scope hereof.

The above examples of possible variations of the present invention are merely illustrative. Accordingly, the present invention is to be considered as including all possible modifications and variations coming within the scope of the invention as defined by the appended claims.

What is claimed is:

1. Improved attachment-interconnect means for use with bubble memory means comprising an E-shaped or U-shaped bubble substrate for mounting one or more bubble memory devices, together with associated printed circuit conductors and electrical coil means including a plurality of coil leads, this interconnect means comprising:
   at least two interal orthogonal interconnect-strip means, with one thereof being attached rigidifyingly across two or more cantilevered arms of the bubble substrate; and
   a plurality of printed circuit connector segments, one attached to each said coil lead, these segments being disposed along two or more of said interconnect-strip means.

2. The combination as recited in claim 1 wherein said coil means comprises a pair of drive coils, each with a pair of coil-leads adapted for ohmic connection with a respective one of the connector segments which are printed along said interconnect-strip means.

3. Novel connector-rigidifier means for rigidifying attachment across the distal ends of certain commonly-directed arm portions of a circuit board for microelectronic components, one said arm portion being enwrapped by one or more electrical coils, each coil including a pair of respective coil-leads;
   said connector-rigidifier means comprising a first connector strip so attached across said substrate arm portions and at least one other connector strip, integral with the first strip and transverse thereto, at least one of said connector strips carrying printed circuit connectors, each one attached to a respective one of said coil leads.

4. The combination as recited in claim 3 wherein said connector strips are so disposed to extend in a plane different from the plane of said circuit board.

5. In a microelectronic package including substrate means projecting a plurality of extended commonly-directed arm portions, together with conductor means and associated electrical mini-components mounted thereon, plus one or more coils wrapping one of said arm portions with associated coil leads projecting therefrom, the combination therewith of:
   interconnector means comprising a first strip disposed to span at least two of said arm portions and bonded thereto rigidifying, plus at least one other strip projected orthogonally from the first strip and integral therewith, and alos a plurality of conductor means printed along the interconnect means, each one coupled in ohmic connection with a respective coil lead.

6. The combination as recited in claim 5 wherein said substrate means is an "E-shaped" printed circuit board projecting three such arm portions, and wherein said first strip extends across the distal end of the three arm portions and is rigidifyingly bonded thereto.

7. The combination as recited in claim 6 wherein said E-shaped board includes a number of conductor segments, each one terminating of a respective output tab aligned along one side of the board; wherein said interconnect strips are disposed in a plane different from that of said board; and wherein said interconnect conductor means comprise printed circuit strips, each ohmically coupled to a respective one of said output tabs.

8. A method of improving a microelectronic package which includes a substrate board characterized by a plurality of commonly-directed cantilever arms around one of which coil means are wrapped, with electrical micro-components mounted on the board along with a number of associated connector means, each ohmically-connected with one of a prescribed array of terminals aligned along one side of said board, the method including the steps of:

providing interconnect means comprising a non-conductive substrate carrying a number of printed conductors, this substrate comprising a first strip portion dimensioned to span said cantilever arms plus at least one other strip portion extending transverse to the first portion and integral therewith; and attaching at least said first strip portion across said arms to rigidify them, while also ohmically connecting said conductors to respective leads of said coil means.

9. The method of claim 8 wherein said micro-components include at least one bubble memory device; wherein the coil means comprises a pair of transverse bubble memory drive coils, each coil presenting a pair of coil leads; and wherein said interconnect conductors are each so connected to a respective one of said coil leads.

* * * * *

UNITED STATES PATENT AND TRADEMARK OFFICE
CERTIFICATE OF CORRECTION

PATENT NO. : 4,429,349

DATED : January 31, 1984

INVENTOR(S) : Clyde L. Zachry

It is certified that error appears in the above-identified patent and that said Letters Patent is hereby corrected as shown below:

Col. 1, line 52, change "oil" to --coil--.
Col. 2, line 43, change "loop]." to --loops].--.
Col. 3, line 6, change "andd" to --and--;
line 22, change "the", second occurrence, to --this--;
line 32, change "have" to --here--.
Col. 4, line 14, change "putting" to --potting--;
line 32, change "7" to --P--;
line 48, change "subjected" to --subjacent--.
Col. 6, line 6, change "interal" to --integral--;
line 44, change "rigidifying," to --rigidifyingly,--;
line 46, change "alos" to --also--;
line 57, change "of" to --at--.

Signed and Sealed this

Seventeenth Day of April 1984

[SEAL]

Attest:

GERALD J. MOSSINGHOFF

Attesting Officer     Commissioner of Patents and Trademarks